United States Patent [19]
Yamaguchi et al.
[11] 4,243,473
[45] Jan. 6, 1981

[54] METHOD FOR DETECTING CRYSTAL DEFECTS IN SEMICONDUCTOR SILICON AND DETECTING SOLUTION THEREFOR

[75] Inventors: Hisayoshi Yamaguchi; Itsuo Kuroyanagi, both of Annaka, Japan

[73] Assignee: Shin-Etsu Handatai Co. Ltd., Tokyo, Japan

[21] Appl. No.: 862,490

[22] Filed: Dec. 20, 1977

[30] Foreign Application Priority Data

Dec. 27, 1976 [JP] Japan ............................ 51/157741

[51] Int. Cl.$^{3}$ ..................... C30B 33/00; H01L 21/30; H01L 21/306

[52] U.S. Cl. ............................. 156/626; 23/230 R; 156/651; 156/662; 356/30

[58] Field of Search ............... 156/601, 626, 662, 651; 252/408; 23/230 R; 356/30, 31

[56] References Cited

U.S. PATENT DOCUMENTS

| | | | |
|---|---|---|---|
| 2,653,085 | 9/1953 | Wynne | 156/662 |
| 2,740,700 | 4/1956 | Fuller | 156/626 |
| 2,973,253 | 2/1961 | Stead | 156/662 |
| 3,108,919 | 10/1963 | Bowman et al. | 156/662 |
| 3,143,447 | 8/1964 | Norr | 23/230 R |
| 3,490,873 | 1/1970 | Cori | 252/408 |

*Primary Examiner*—Bradley R. Garris
*Attorney, Agent, or Firm*—Toren, McGeady and Stanger

[57] ABSTRACT

Method for detecting crystal defects in semiconductor silicon which comprises treating a preliminarily mirror etched crystal of semiconductor silicon with a detecting solution which is a mixture of about 50% hydrofluoric acid solution and concentrated nitric acid in a ratio of 1000 to 0.1-20 by volume added with an anionic surfactant, and thereafter applying renewedly a mirror etching thereto. Also provided is a detecting solution therefor. Practice of the method causes no occupational disease and no environmental pollution with respect to hexavalent chromium.

2 Claims, 4 Drawing Figures

METHOD FOR DETECTING CRYSTAL DEFECTS IN SEMICONDUCTOR SILICON AND DETECTING SOLUTION THEREFOR

BACKGROUND OF THE INVENTION

1. Field of the Invention

This invention relates to a method for detecting crystal defects in semiconductor silicon and also to a detecting solution therefor.

2. Description of the Prior Art

The use of detecting solutions which are mixtures of chromic anhydride and hydrofluoric acid for detecting crystal defects in semiconductor silicon is known. One of these solutions has been adopted as a detecting solution in the Japanese Industrial Standards. However, the known detecting solutions have a drawback in that their use and disposal may cause occupational diseases and environmental pollution because they contain a large amount of hexavalent chromium.

More particularly, the use of a mixed acid consisting of one part by volume of hydrofluoric acid (50%) and one part by volume of a solution obtained by dissolving 50 g of chromic anhydride in 100 cc of water to detect crystal defects in semi-conductor silicons which are broadly used as material in present-day electronics industry is known. Since the mixed acid includes a great amount of hexavalent chromium, a mist emerges in the course of etching and results in a dispersal of chromic acid in the air to pollute the working atmosphere. Thus, such use can cause an occupational disease due to the hexavalent chromium. In addition, the waste liquor from the processing has a high content of hexavalent chromium and presents environmental pollution problems to land and water.

SUMMARY OF THE INVENTION

According to this invention there is provided a novel method for detecting crystal defects in semi-conductor silicon comprising treating a preliminarily mirror etched crystal of semi-conductor silicon with a detecting solution which is a mixture of about 50 percent hydrofluoric acid solution and concentrated nitric acid in a ratio of 1000 to 0.1–20 by volume admixed with an anionic surfactant, and thereafter again applying a mirror etching thereto. In another aspect of the present invention, there is provided a novel detecting solution for revealing crystal defects in semi-conductor silicon which comprises a mixture of about 50 percent hydrofluoric acid solution and concentrated nitric acid in a ratio of 1000 to 0.1–20 by volume added with an anionic surfactant. The method of this invention gives a remarkable effect that no problems as to occupational diseases and environmental pollution arises with respect to hexavalent chromium.

Therefore, it is a primary object of this invention to provide a method for detecting crystal defects in semiconductor silicon without using hexavalent chromium.

It is also a primary object of this invention to provide a detecting solution having no hexavalent chromium.

Still further objects and advantages of the invention will appear from the more detailed disclosure set forth below. In connection with that more detailed description the drawing shows the following.

All figures represent photomicrographs (160 X magnification).

DESCRIPTION OF THE PREFERRED EMBODIMENT

In the prior art, an etchant composed of 50% hydrofluoric acid solution and concentrated nitric acid in a volume ratio of 1–10:10–1 has been employed for mirror etching the semi-conductor silicon, and a so-called stain etchant composed of 50% hydrofluoric acid solution and concentrated nitric acid in a volume ratio of 100:0.1–0.5 has been used for detecting a p-n or n-n+ junction. However, none of these etchants can detect crystal defects.

As contrasted with these prior etchants, the detecting solution according to this invention is for detecting crystal defects. In the composition of the detecting solution of this invention, the volume ratio of concentrated nitric acid (about 72%) to about 50% hydrofluoric acid solution is lowered extremely to the extent of 0.1–2.0:1000. Moreover, the detecting solution contains a small amount of an anionic surfactant.

Employable anionic surfactants include those of sulfate-, sulfonate-, and phosphate types. Preferable anionic surfactants are sodium alkylbenzenesulfonates wherein the alkyl radical has 11 to 15 carbon atoms, such as dodecyl radical, sodium alkylnaphthalenesulfonates wherein the alkyl radical has 3 to 5 carbon atoms, such as isopropyl radical, and mixtures thereof. The addition of an anionic surfactant specified above has conspicuous effects that the selective etching of semi-conductor silicon is promoted and the surface subjected to detection is smoothed without agitating the detecting solution used. The concentration of an anionic surfactant should be in the range of 0.001 to 0.5%. An amount less than 0.001% has no effect. An excess of anionic surfactant addition over 0.5% does not increase the effect.

In order to detect crystal defects in a crystal of semiconductor silicon according to this invention, a surface of said crystal to be examined is preliminarily mirror etched as a pretreatment, and thereafter, the surface is subjected to a main treatment with a detecting solution having the specified composition of this invention. In the main treatment, a selective etching proceeds to detect crystal defects. This treatment is completed within a relatively short time of 5 to 20 minutes, whereas the common selective etching requires a time of 5 to 30 minutes. In addition, the detecting solution for main treatment has a great advantage over the prior detecting solution in that the detecting solution brings about no occupational disease nor environmental pollution because of the solution is free from any heavy metal element. According to this invention, a specimen which has been subjected to the main treatment is further mirror etched as a post-treatment. The observation of detected crystal defects is easily performed by virtue of this post-treatment.

This invention is further illustrated by the following example of a specific embodiment thereof.

EXAMPLE

Figure 1:
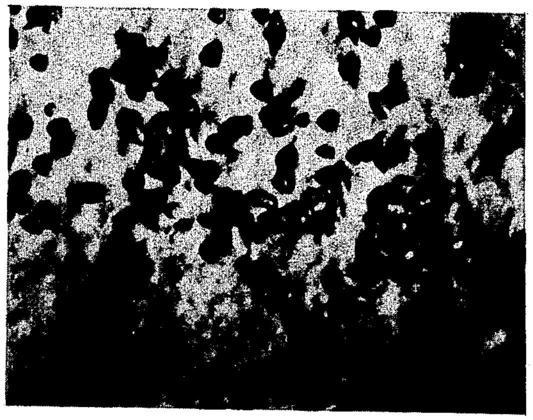
FIG. 1 shows an enlarged view of etch pits obtained on a specimen in accordance with the method of this invention.

A semi-conductor silicon wafer having a diameter of 50 mm and a (111) crystal orientation, which has been produced by a floating zone process, is preliminarily mirror etched for 2 minutes with a mirror etching solution comprising a mixture of hydrofluoric acid solution (50%), concentrated nitric acid (72%) and acetic acid (99.5%) in a volume ratio of 3:5:3. Thereafter, thus-treated wafer is selectively etched for 10 minutes with a detecting solution which is a mixture of 50 percent hydrofluoric acid solution and concentrated nitric acid (72%) in a volume ratio of 1000:10 added with 0.1% of an anionic surfactant, i.e. sodium isopropylnaphthalenesulfonate. When the wafer is finally post-treated for one minute with said mirror etching solution, etch pits appear as shown in FIG. 1. The shape of the obtained etch pits takes the form of an equilateral triangle having laterals of about 30 μm. The average etch pit density is $2.5\times10^4/cm^2$.

Figure 2:
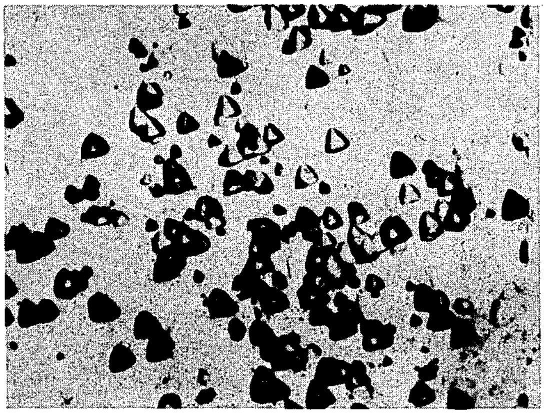
FIG. 2 shows an enlarged view of etch pits obtained on a specimen of the same kind with that in FIG. 1 in accordance with the prior art method.

In FIG. 2, an enlarged view of etch pits which are detected on a wafer identical with that in FIG. 1 by the following prior method using hexavalent chromium is shown.

(1) Pretreatment

The wafer is mirror etched for 3 minutes by means of an etchant consisting of 50% hydrofluoric acid solution, concentrated nitric acid (72%) and 99.5% acetic acid solution in a volume ratio of 3:5:3.

(2) Main treatment

The mirror etched wafer is selectively etched for 15 minutes with a mixed acid composed of one part of a solution obtained by dissolving 50 g of chromic anhydride in 100 cc of water and one part of 50% hydrofluoric acid solution.

Figure 3:
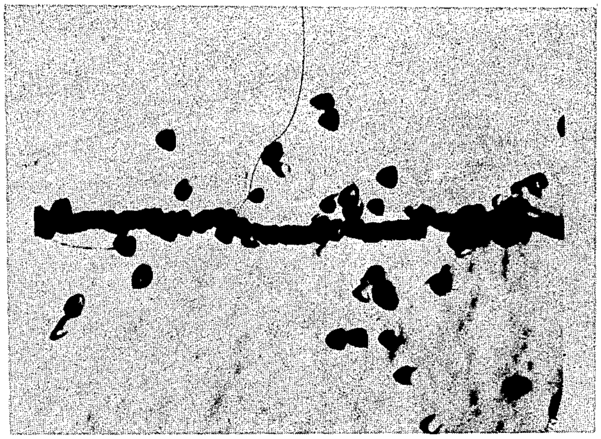
FIG. 3 is an enlarged view of etch pits including lineages obtained on another specimen according to the method of this invention.

A specimen which has the same kinds of crystal defects as those of the specimen in FIG. 1 with the sole exception that the former has lineages is treated by the same procedures with the etchants of the same compositions as in the case of FIG. 1. An enlarged view of the resulted crystal is shown in FIG. 3. Shallow pits and line defects can be observed therein.

Figure 4:
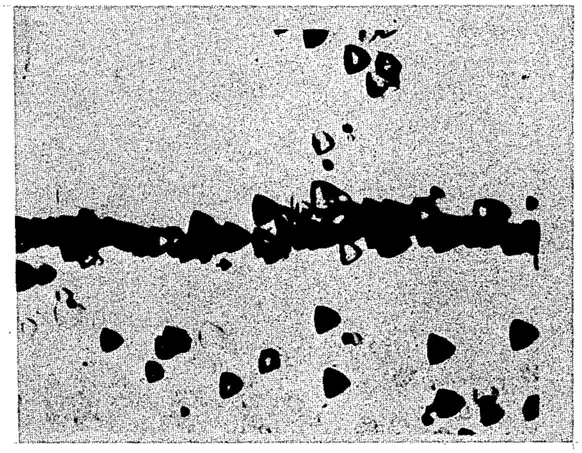
FIG. 4 is an enlarged view of etch pits including lineages obtained on a specimen of the same kind with that in FIG. 3 according to the prior method.

A specimen identical with that of FIG. 3, that is to say, having lineages is treated by the above-mentioned prior method using hexavalent chromium. An enlarged view of the resulted crystal is shown in FIG. 4. Lineages are evidently detected.

When a mixed solution consisting of 50% hydrofluoric acid solution and concentrated nitric acid (72%) in a volume ratio of 1000:10 without an anionic surfactant is employed in the course of main treatment, no crystal defect can be detected.

In the detecting solution for main treatment of this invention, the amount of concentrated nitric acid (72%) should be within the range of 0.1 to 20 parts by volume per 1000 parts by volume of about 50% hydrofluoric acid solution. The amount can be varied within this range, depending on the kind of crystal, i.e. preparing method, resistivity, orientation, etc. and on the kind of defect to be detected. Detecting solutions having less nitric acid are mainly applied to crystals prepared by the CZ process, whereas those containing much nitric acid are appropriate to apply to crystals prepared by the FZ process. A detecting solution containing 0.1–5 parts by volume of concentrated nitric acid (72%) per 1000 parts by volume of about 50% hydrofluoric acid solution is the most suitable to detect line defects. A detecting solution containing 1 to 8 parts of concentrated nitric acid per 1000 parts of about 50% hydrofluoric acid solution is the most suitable to detect shallow pits and/or conical etch pits. To detect dislocations, i.e. so-called etch pits, and lineages, an amount of 6 to 20 parts by volume of concentrated nitric acid (72%) per 1000 parts by volume of about 50% hydrofluoric acid solution is the most suitable.

Since the method of this invention enables an exact detection of crystal defects in semi-conductor silicon within in a short period of time and the detecting solution of this invention can cause no environmental pollution, this invention is of great value.

What is claimed is:

1. A method for detecting crystal defects in semi-conductor silicon comprising treating a preliminary mirror etched crystal of semi-conductor silicon for about 5 to 20 mintues with a detecting solution which is a mixture of about 50 percent hydrofluoric acid solution and concentrated nitric acid in a ratio of 1000 to 0.1–20 by volume added with an anionic surfactant, and thereafter, applying renewedly a mirror etching thereto.

2. A method as set forth in claim 1 wherein the concentration of said anionic surfactant added is in the range of 0.001 to 0.5%.

* * * * *